United States Patent [19]
Crockett

[11] Patent Number: 5,363,276
[45] Date of Patent: Nov. 8, 1994

[54] APPARATUS FOR CONTAINING AND SUPPORTING ELECTRONIC COMPONENTS

[75] Inventor: Robert J. Crockett, Central, S.C.

[73] Assignee: NCR Corporation, Dayton, Ohio

[21] Appl. No.: 115,300

[22] Filed: Sep. 1, 1993

[51] Int. Cl.5 .............................................. H05K 5/00
[52] U.S. Cl. .................................. 361/752; 174/52.1; 257/678; 257/725
[58] Field of Search ............. 174/65 SS, 65 G, 138 E, 174/138 G, 152 G, 153 G, 52.1, 52.3, 52.4; 361/752, 758, 796, 797, 804, 770; 257/678, 725

[56] References Cited

U.S. PATENT DOCUMENTS

| | | | |
|---|---|---|---|
| 3,952,152 | 4/1976 | Lill et al. | 178/7.82 |
| 4,063,289 | 12/1977 | Veenendaal | 358/242 |
| 4,246,613 | 1/1981 | Choder et al. | 358/245 |
| 4,338,635 | 7/1982 | Haider et al. | 358/254 |
| 4,381,421 | 4/1983 | Coats et al. | 174/35 R |
| 4,455,460 | 6/1984 | Bunnell | 200/64 |
| 4,652,932 | 3/1987 | Miyajima et al. | 358/236 |
| 4,778,357 | 10/1988 | Arai et al. | 417/417 |
| 4,831,211 | 5/1989 | McPherson et al. | 174/35 R |
| 4,898,555 | 2/1990 | Sampson | 445/22 |
| 4,958,889 | 9/1990 | Boyle et al. | 312/208 |
| 4,964,017 | 10/1990 | Jindrick et al. | 361/724 |
| 4,979,636 | 12/1990 | Daly | 220/324 |
| 5,021,763 | 6/1991 | Obear | 340/407 |
| 5,036,313 | 7/1991 | Lin et al. | 340/700 |
| 5,084,757 | 1/1992 | Leo et al. | 358/248 |
| 5,145,434 | 9/1992 | Pauplis et al. | 445/23 |
| 5,150,231 | 9/1992 | Iwamoto et al. | 359/44 |
| 5,164,542 | 11/1992 | Hart | 174/35 MS |
| 5,239,133 | 8/1993 | BEck et al. | 174/65 R |
| 5,241,451 | 8/1993 | Walburn et al. | 361/785 |

*Primary Examiner*—Bot Ledynh
*Attorney, Agent, or Firm*—Paul J. Maginot

[57] ABSTRACT

An apparatus for containing and supporting electronic components includes a first housing portion having a first support, and a second housing portion having a second support. The apparatus further includes an elastomeric isolating member being secured between the first support and the second support so as to position the isolating member within the apparatus. Moreover, the apparatus further includes a base upon which electronic components are mounted, the base being attached to the elastomeric isolating member.

4 Claims, 3 Drawing Sheets

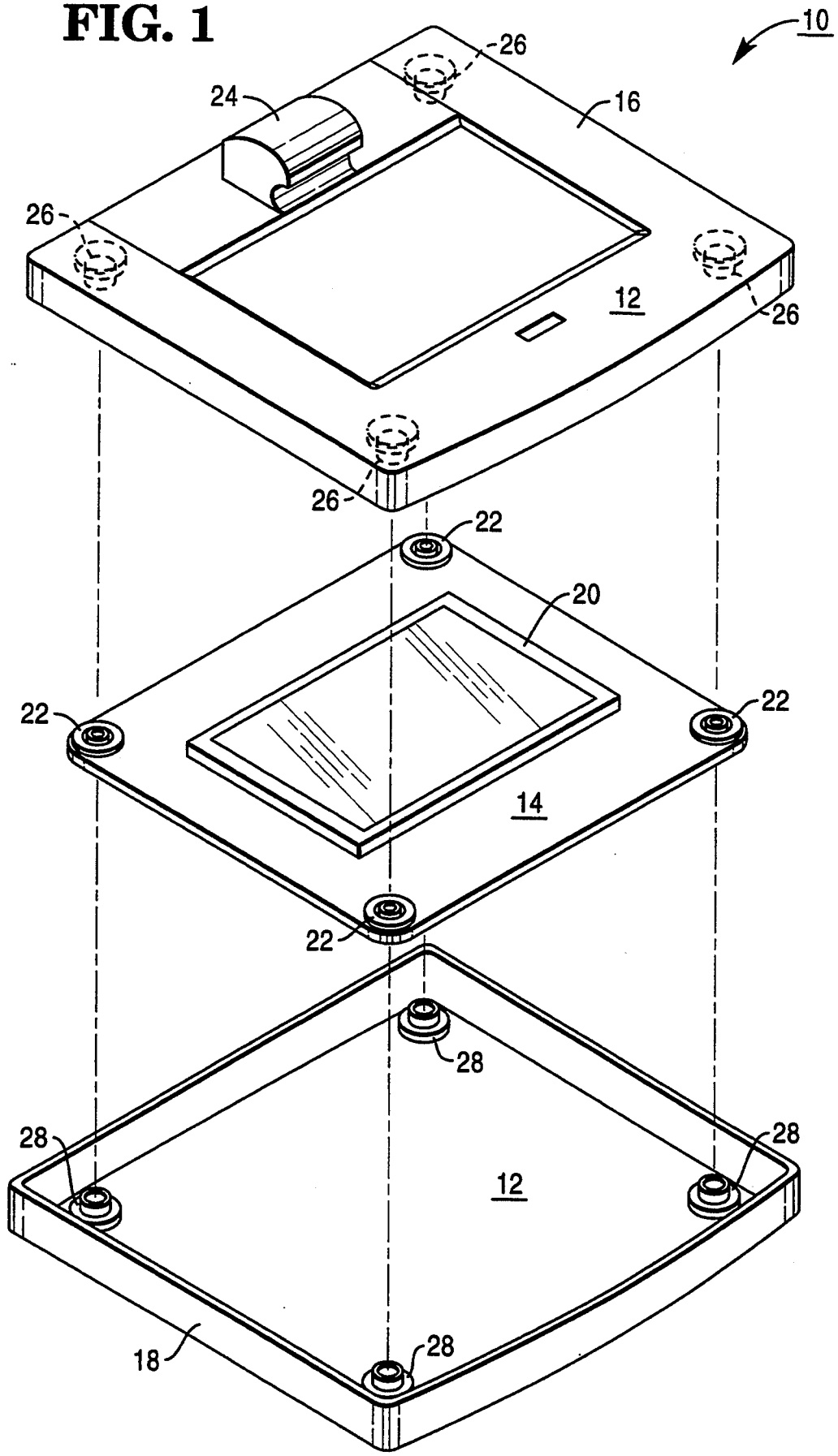

APPARATUS FOR CONTAINING AND SUPPORTING ELECTRONIC COMPONENTS

BACKGROUND OF THE INVENTION

Cross reference is made to co-pending U.S. Pat. applications Ser. No. 08/15,299, entitled "Computer Display Assembly" by Robert J. Crockett; Ser. No. 08/115,376, entitled "Computer Housing Seal" by Robert J. Crockett; Ser. No. 08/115,298, entitled "Isotropic Shock Mounting" by Randal A. Burke; and Ser. No. 29/012,456, entitled "Portable Computer" by Donald Carr, Scott Belliveau and Robert Paterson, all assigned to the same assignee as the present invention, and all filed concurrently herewith.

The present invention relates generally to electronic devices, and more particularly to an apparatus for containing and supporting electronic components.

Portable computers are becoming increasingly popular. Use of a portable computer typically involves transporting the computer from a storage site to a remote operating site and then back to the storage site. With the increase in mobility of the portable computer, there is an increase in potential for damage to the computer due to mechanical shock inadvertently applied to the device during its transportation. For example, much damage may be inflicted upon a portable computer by dropping the computer to the ground from a height of a few feet.

It would be desirable to provide a portable computer which has a greater resistance to damage from mechanical shock so as to make the computer more rugged. It would also be desirable to provide a rugged portable computer which is easy to assemble and inexpensive to manufacture.

SUMMARY OF THE INVENTION

In accordance with one embodiment of the present invention, there is provided an apparatus for containing and supporting electronic components. The apparatus includes a housing and an elastomeric grommet positioned within the housing. The apparatus further includes a base upon which electronic components are mounted, a portion of the base being secured to the elastomeric grommet.

Pursuant to another embodiment of the present invention, there is provided an apparatus for housing and protecting electronic components of a portable computer. The apparatus includes a first housing portion having an inner side. The apparatus further includes a plurality of first support members attached to the inner side of the first housing portion. The apparatus additionally includes a second housing portion having an inner side. Moreover, the apparatus includes a plurality of second support members attached to the inner side of the second housing portion, wherein the plurality of first support members cooperate with the plurality of second support members so as to form a plurality of isolator receptacles within the housing. The apparatus further includes a plurality of elastomeric isolators positionable in the plurality of isolator receptacles. The apparatus additionally includes a base upon which electronic components are mounted, the base being attached to each of the plurality of elastomeric isolators.

In accordance with yet another embodiment of the present invention, there is provided an apparatus for containing and supporting electronic components. The apparatus further includes a first housing portion having a first support, and a second housing portion having a second support. The apparatus additionally includes an isolating member being secured between the first support and the second support so as to position the isolating member within the apparatus. Moreover, the apparatus further includes a base upon which electronic components are mounted, the base being attached to the isolating member.

Pursuant to still another embodiment of the present invention, there is provided a notepad computer which includes a display and input device. The notepad computer further includes a base for supporting the display and input device. Moreover, the notepad computer includes a housing for containing the display and input device and the base, the housing defining an opening through which the display and input device is accessible. The notepad computer additionally includes an elastomeric isolating member being secured between the base and the housing.

It is therefore an object of the present invention to provide a new and useful apparatus for containing and supporting electronic components.

It is also an object of the present invention to provide a new and useful notepad computer.

It is a further object of the present invention to provide an improved apparatus for containing and supporting electronic components.

It is another object of the present invention to provide a housing for a portable computer which has a greater resistance to damage from mechanical shock so as to make the computer more rugged.

It is still another object of the present invention to provide a rugged portable computer which is easy to assemble and inexpensive to manufacture.

The above and other objects, features, and advantages of the present invention will become apparent from the following description and the attached drawings.

BRIEF DESCRIPTION OF THE DRAWINGS

FIG. 1 is an exploded perspective view of the apparatus for containing and supporting electronic components which incorporates the features of the present invention therein;

DETAILED DESCRIPTION OF THE PREFERRED EMBODIMENT

Figure 2A:
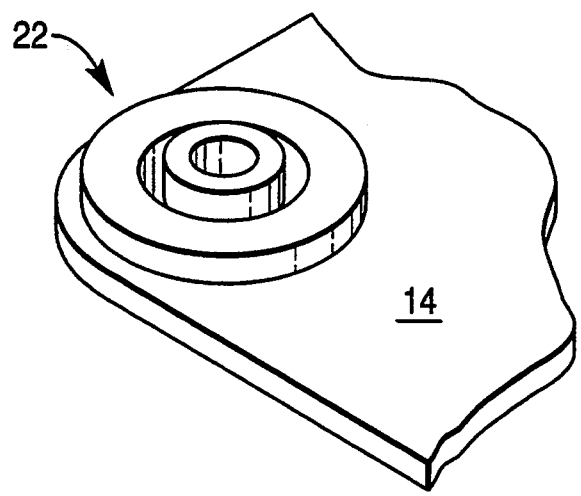
FIG. 2A is a fragmentary perspective view of the base which supports electronic components thereon with the base shown attached to the grommet.

While the invention is susceptible to various modifications and alternative forms, a specific embodiment thereof has been shown by way of example in the drawings and will herein be described in detail. It should be understood, however, that there is no intention to limit the invention to the particular form disclosed, but on the contrary, the intention is to cover all modifications, equivalents, and alternatives falling within the spirit and scope of the invention as defined by the appended claims.

Figure 3:
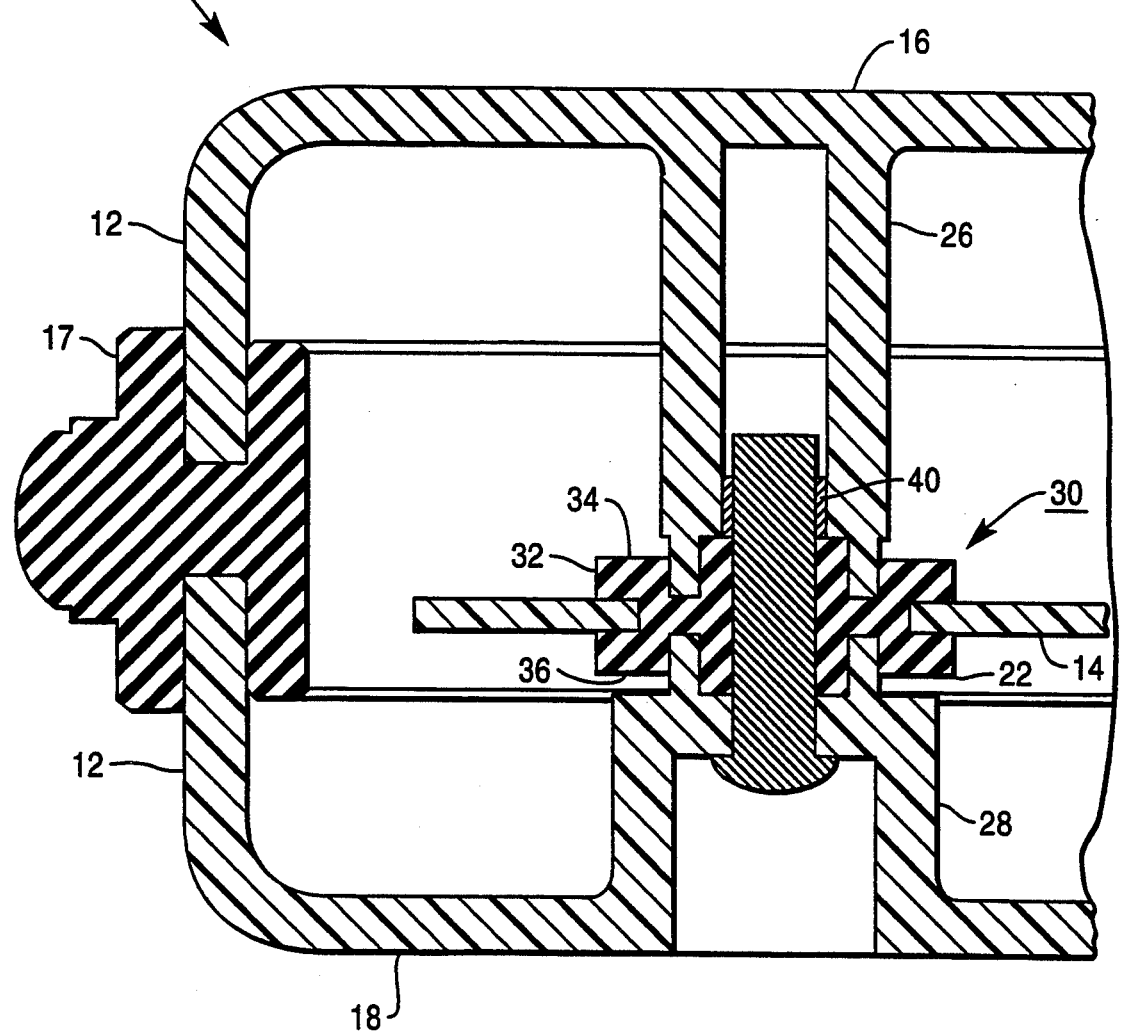
FIG. 3 is a fragmentary sectional elevational view of the containing and supporting apparatus of FIG. 1 with the grommet shown positioned within the grommet receptacle.

Referring now to FIG. 1, there is shown an apparatus for containing and supporting electronic components, generally indicated by the reference numeral 10. The apparatus 10 includes a housing 12 and a base 14. The housing 12 includes an upper housing portion 16 and a lower housing portion 18. The specific structure of each of the housing portions 16 and 18 are not shown in detail in the FIGURES but may include a substrate with an overmold material positioned over the substrate and secured thereto. By way of example, the substrate may be made from a modified nylon material such as Noryl, a trademark of General Electric Company of Fairfield, Conn. Also by way of example, the overmold material may be made of a thermoplastic elastomer such as Krayton, a trademark of Shell Oil Company of Houston, Tex. The base 14 is a printed circuit board having electrical components (not shown) mounted thereon. Moreover, a liquid crystal display and digitizer input device 20 is secured to the base 14. The upper housing portion 16 includes a clip 24 for holding a stylus (not shown) used to input information on the display and input device 20. A plurality of grommets or isolating members 22 are secured to the base 14. Each of the grommets 22 are made from an elastomeric material. By way of example, one elastomeric material which may be used is a material available as model no. VL-03(high impact absorbing material) from EAR Specialty Composite, Inc. of Indianapolis, Ind. Another elastomeric material which may be used is Scotchdamp, a trademark of 3M Corporation of St. Paul, Minn. and available as model no. SJ2015X. As further shown in FIG. 1, the upper housing portion 16 includes a plurality of first support members 26 and the lower housing portion 18 includes a plurality of second support members 28. Each of the first support members 26 extends away from the upper housing portion 16 and terminates at a distal end. A nut 40 is friction fit in the interior of each of the first support members 26 (see FIG. 3). Each of the second support members 28 extends away from the lower housing portion 18 and terminates at a distal end. When the housing portions 16 and 18 are positioned relative to each other so as to contain the base 14 (see FIG. 3), the plurality of first support members 26 cooperate with the plurality of second support members 28 so as to form a plurality of grommet or isolator receptacles 30 within the housing 12. One such grommet receptacle 30 is shown in FIG. 3. The upper housing portion 16 has an opening defined therein as shown in FIG. 1. Also, when the housing portions 16 and 18 are positioned relative to each other so as to contain the base 14 (see FIG. 3), the display and input device 20 is accessible to a user for viewing and inputting data.

Figure 2B:
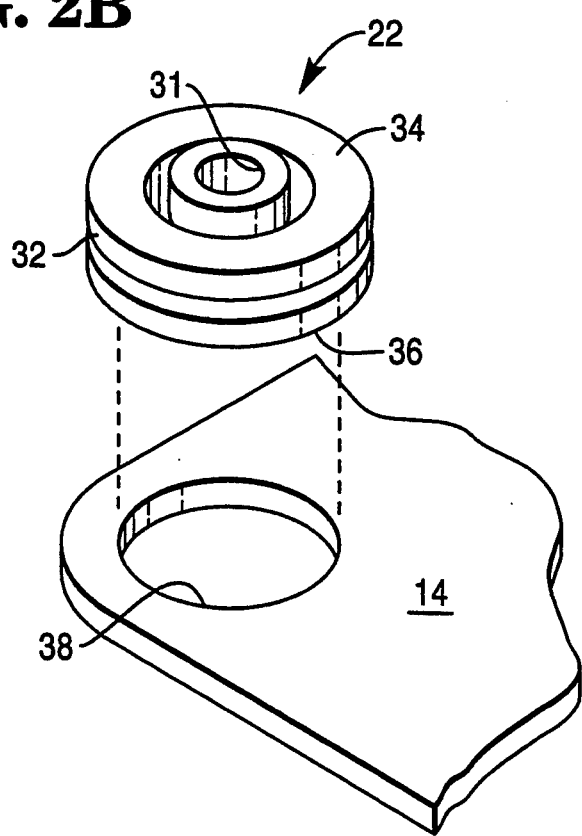
FIG. 2B is a fragmentary perspective view of the base and grommet of FIG. 2A with the grommet shown separated from the base for clarity of description.

FIG. 2A shows grommet 22 attached to a portion of base 14. FIG. 2B shows the grommet 22 separated from the portion of the base 14 for clarity of description. Each of the plurality of grommets 22 are similar in construction and therefore only one will be described in detail. The grommet 22 has a substantially annular shape so as to define a central passage 31, a peripheral edge portion 32, a first side 34 and a second side 36. The peripheral edge portion 32 has a first groove defined therein, the first side 34 has a second groove defined therein, and the second side 36 has a third groove defined therein as shown in FIGS. 2A, 2B and 3. The base 14 has a plurality of apertures 38 defined therein. Each of the plurality of apertures 38 are similar in construction and thus only one will be discussed in detail. One such aperture is shown in FIG. 2B. The aperture 38 exposes an inner edge around the periphery thereof. The inner edge defined by the aperture 38 is positionable in the first groove defined in the peripheral edge portion 32 of the grommet 22 so as to secure the portion of the base 14 to the grommet 22 as shown in FIGS. 2A and 3.

FIG. 3 shows the grommet 22 positioned within the grommet receptacle 30. When the grommet 22 is positioned as above, the distal end of the first support member 26 is positioned in the second groove of the first side 34 of grommet 22, and further, the distal end of the second support member 28 is positioned in the third groove of the second side 36 of grommet 22. A screw 42 extends through the central passage 31 of grommet 22 and meshingly engages the nut 40 so as to secure the upper housing portion 16 to the lower housing portion 18. The other of the plurality of grommets 22 are similarly positioned within the other of the plurality of grommet receptacles. A protective bumper seal 17 is interposed between the upper housing portion 16 and the lower housing portion 18 and further extends outwardly from the housing 12 as shown in FIG. 3. The protective bumper seal 17 extends entirely around the periphery of the containing and supporting apparatus 10. The protective bumper seal 17 is made from a silicone rubber material.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. An apparatus for containing and supporting electronic components, comprising: a housing; an elastomeric grommet positioned within said housing; and a base upon which electronic components are mounted, a portion of said base being secured to said elastomeric grommet,
    wherein said elastomeric grommet has a first groove defined in the peripheral edge thereof,
    wherein the portion of said base is positionable within the first groove of said elastomeric grommet,
    wherein said housing comprises a first housing portion having a first support and a second housing portion having a second support, and
    wherein said elastomeric grommet has (1) a second groove defined in a first side thereof, wherein a distal end of the first support is positionable within the second groove, and (2) a third groove defined in a second side thereof, wherein a distal end of the second support is positionable within the third groove.

2. An apparatus for housing and protecting electronic components of a portable computer, comprising:
    a first housing portion having an inner side;
    a plurality of first support members attached to the inner side of said first housing portion;
    a second housing portion having an inner side;
    a plurality of second support members attached to the inner side of said second housing portion, wherein said plurality of first support members cooperate with said plurality of second support members so as to form a plurality of isolator receptacles within the first housing portion and the second housing portion;

a plurality of elastomeric isolators positionable in the plurality of isolator receptacles; and a base upon which electronic components are mounted, said base being attached to each of said plurality of elastomeric isolators.

3. The apparatus of claim 2, wherein said base has a plurality of apertures defined therein, said plurality of elastomeric isolators being secured within the plurality of apertures.

4. An apparatus for containing and supporting electronic component comprising:

a first housing portion having a first support;

a second housing portion having a second support;

an isolating member being secured between the first support and the second support so as to position said isolating member within the apparatus; and a base upon which electronic components are mounted, said base being attached to said isolating member, wherein said isolating member comprises an elastomeric grommet having a first groove defined in the peripheral edge thereof, wherein a portion of said base is positionable within the first groove, and wherein said elastomeric grommet further has:

a second groove defined in a first side thereof, wherein a distal end of the first support is positionable within the second groove, and a third groove defined in a second side thereof, wherein a distal end of the second support is positionable within the third groove.

* * * * *